United States Patent
Ootsuga et al.

(10) Patent No.: US 11,264,201 B2
(45) Date of Patent: Mar. 1, 2022

(54) CHARGED PARTICLE BEAM DEVICE

(71) Applicant: HITACHI HIGH-TECH CORPORATION, Tokyo (JP)

(72) Inventors: Kazuo Ootsuga, Tokyo (JP); Yuta Imai, Tokyo (JP); Tsunenori Nomaguchi, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 17/058,259

(22) PCT Filed: Jun. 12, 2018

(86) PCT No.: PCT/JP2018/022463
§ 371 (c)(1),
(2) Date: Nov. 24, 2020

(87) PCT Pub. No.: WO2019/239497
PCT Pub. Date: Dec. 19, 2019

(65) Prior Publication Data
US 2021/0217580 A1    Jul. 15, 2021

(51) Int. Cl.
*H01J 37/22* (2006.01)
*H01J 37/244* (2006.01)
*H01J 37/28* (2006.01)

(52) U.S. Cl.
CPC .......... *H01J 37/222* (2013.01); *H01J 37/244* (2013.01); *H01J 37/28* (2013.01)

(58) Field of Classification Search
CPC ........ H01J 37/222; H01J 37/244; H01J 37/28; H01J 2237/24495; H01J 2237/24485; H01J 2237/24475
See application file for complete search history.

(56) References Cited

U.S. PATENT DOCUMENTS

2012/0043463 A1   2/2012   Agemura et al.
2014/0175279 A1*  6/2014   Agemura ................ H01J 37/28
                                                      250/310
(Continued)

FOREIGN PATENT DOCUMENTS

JP   H11-295246 A   10/1999
JP   2003-007244 A   1/2003
(Continued)

OTHER PUBLICATIONS

International Search Report, English Translation, PCT/JP2018/022463 dated Aug. 28, 2018, 2 pgs.

*Primary Examiner* — David A Vanore
(74) *Attorney, Agent, or Firm* — Volpe Koenig

(57) ABSTRACT

A charged particle beam device includes: a charged particle beam source configured to generate a charged particle beam with which a sample is irradiated; a charged particle detection unit configured to detect a charged particle generated when the sample is irradiated with the charged particle beam; an intensity data generation unit configured to generate intensity data of the charged particle detected by the charged particle detection unit; a pulse-height value data generation unit configured to generate pulse-height value data of the charged particle detected by the charged particle detection unit; and an output unit configured to output a first image of the sample based on the intensity data and a second image of the sample based on the pulse-height value data.

13 Claims, 11 Drawing Sheets

(56) References Cited

U.S. PATENT DOCUMENTS

2018/0247790 A1* 8/2018 Li .................. H01J 37/244
2021/0217580 A1* 7/2021 Ootsu ............... H01J 37/244

FOREIGN PATENT DOCUMENTS

| | | |
|---|---|---|
| JP | 2010-257855 A | 11/2010 |
| JP | 2013-033671 A | 2/2013 |
| JP | 2014-066518 A | 4/2014 |
| JP | 2016-170896 A | 9/2016 |

* cited by examiner

[FIG. 1]
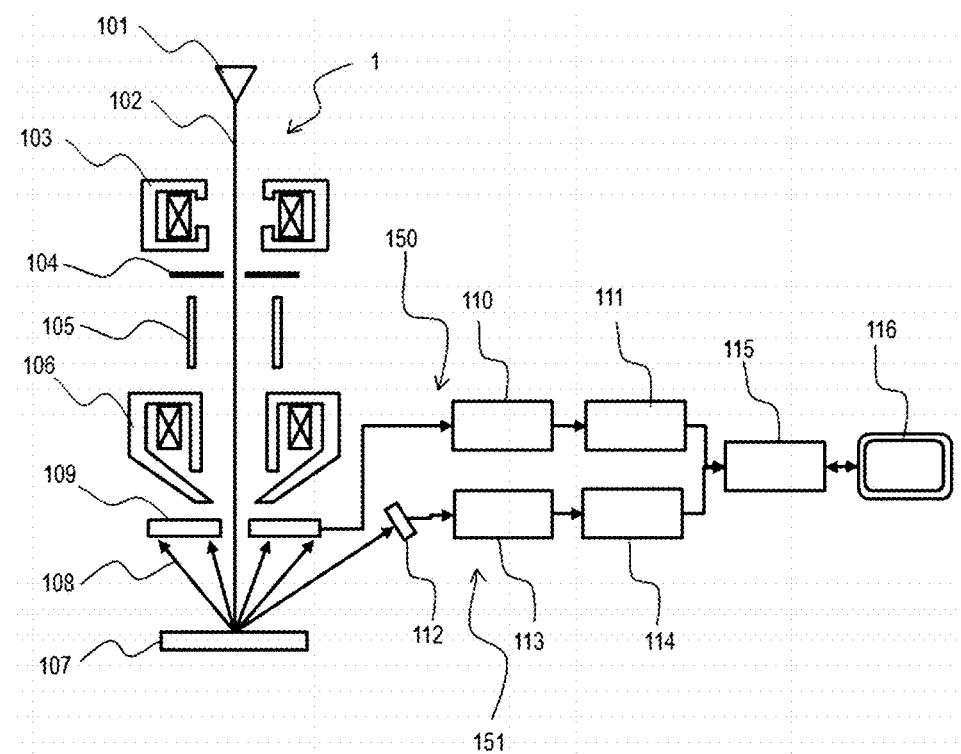

[FIG. 2]
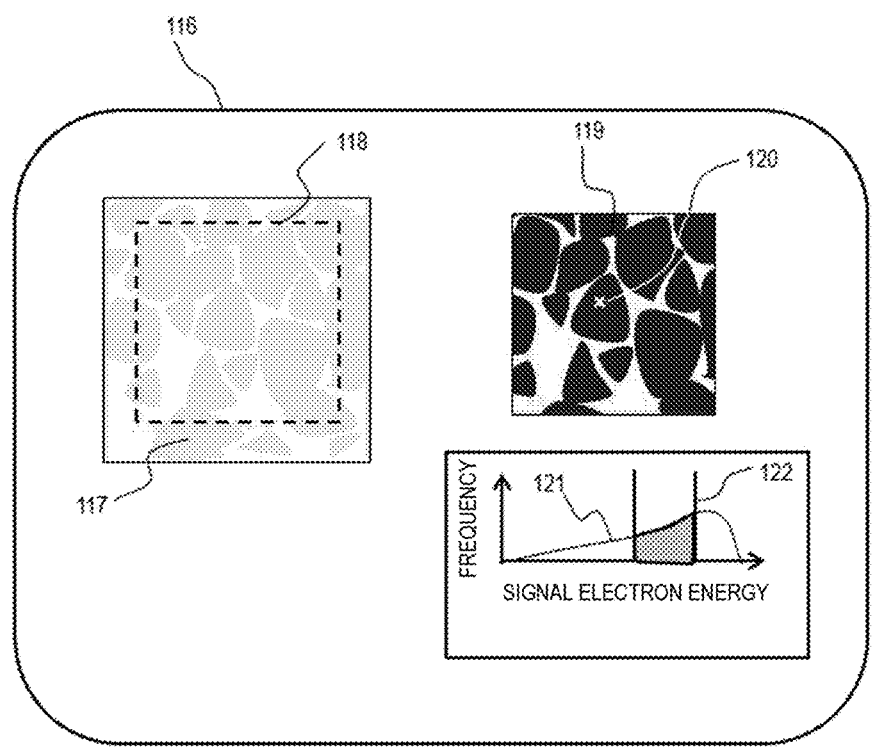

[FIG. 3]
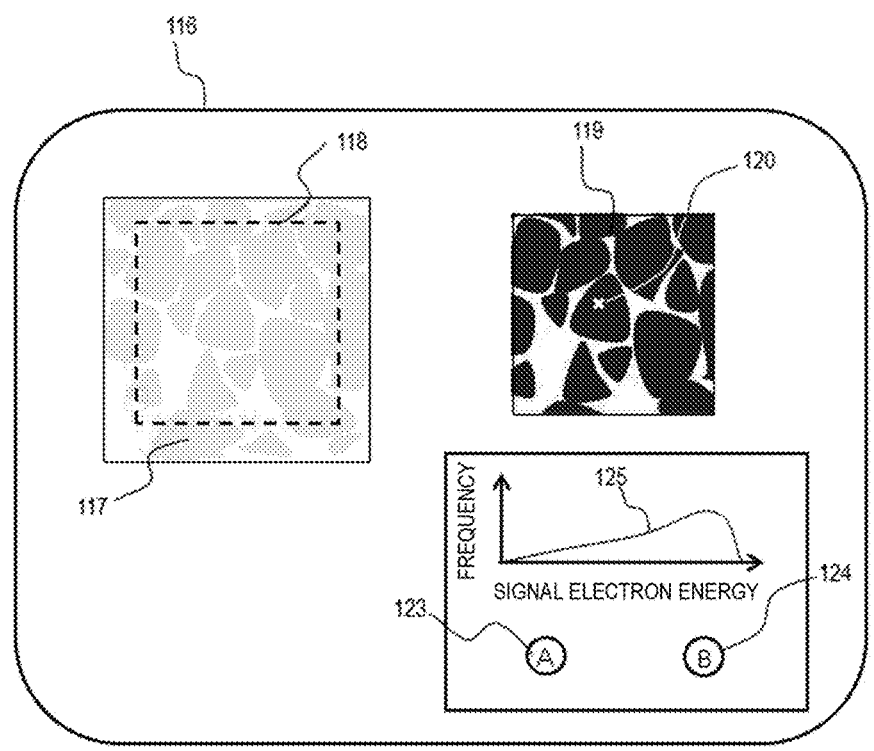

[FIG. 4]
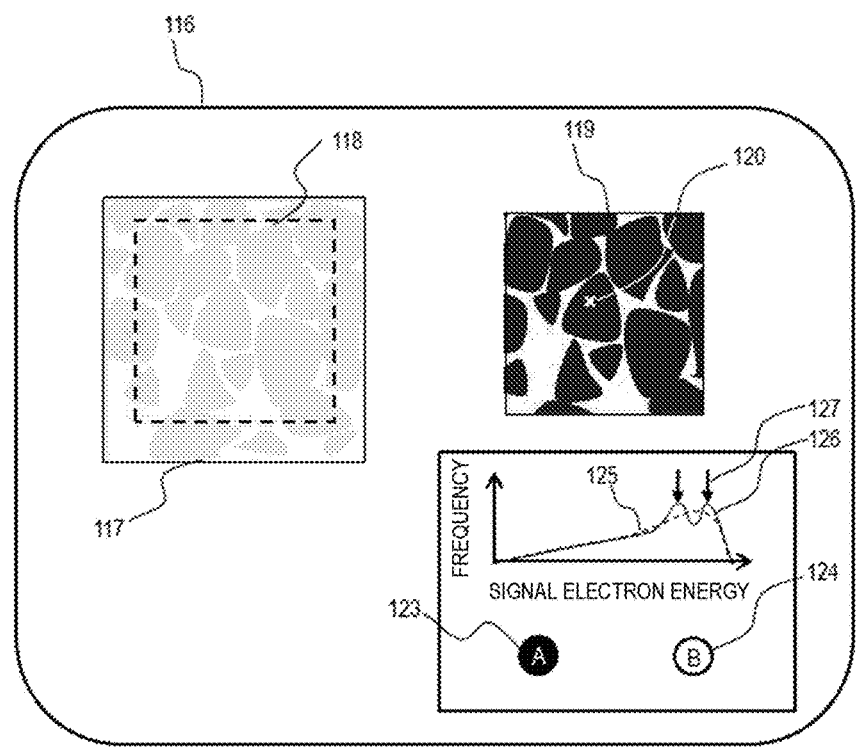

[FIG. 5]
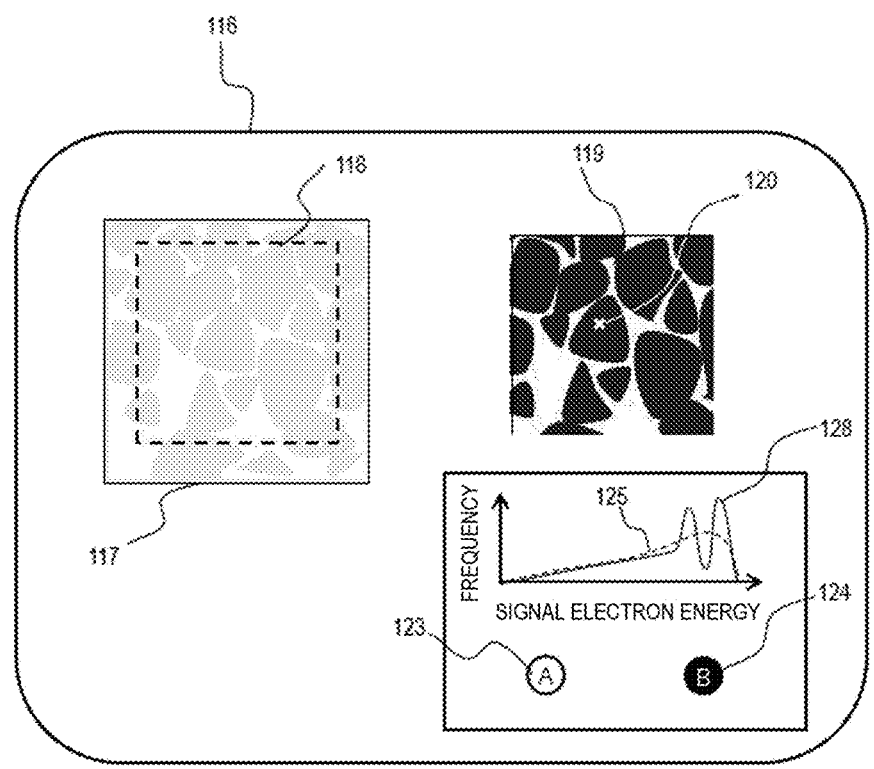

[FIG. 6]
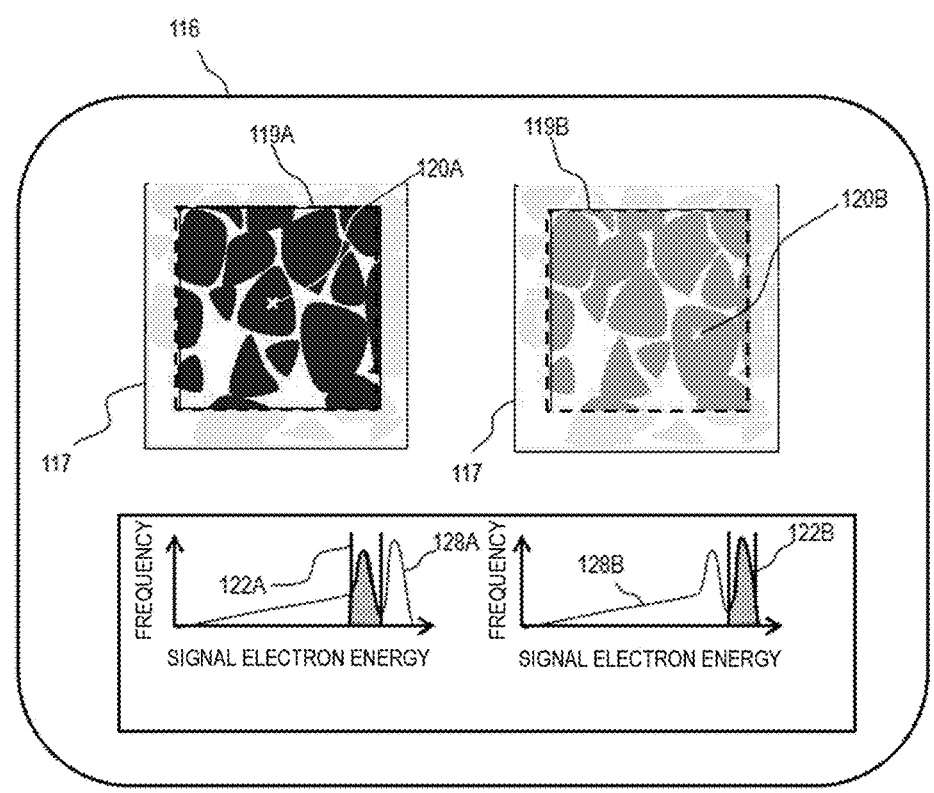

[FIG. 7]
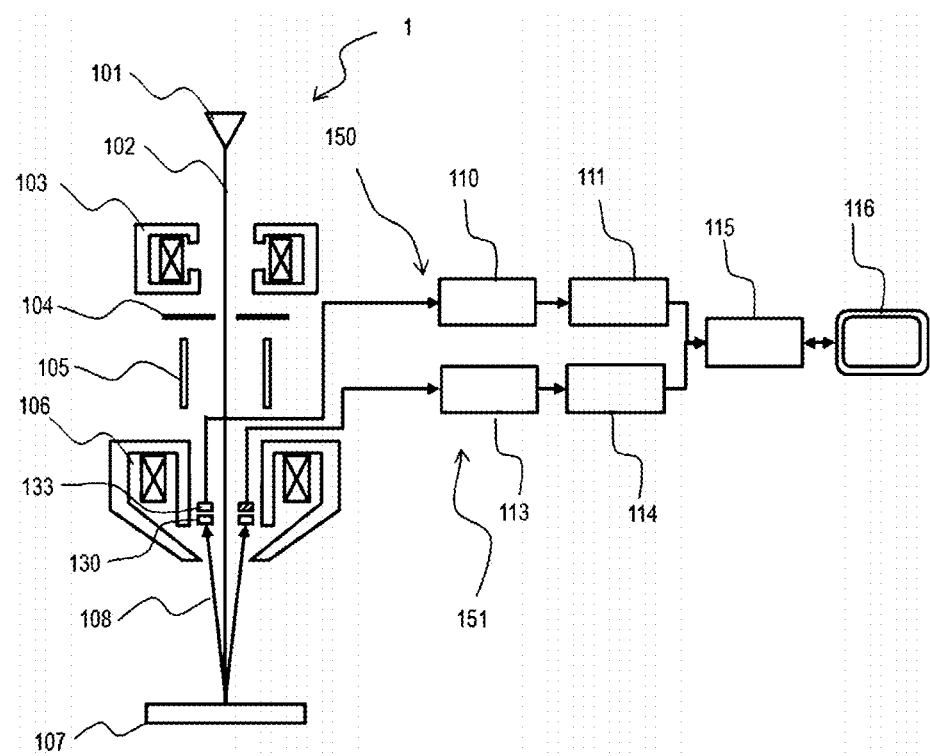

[FIG. 8]
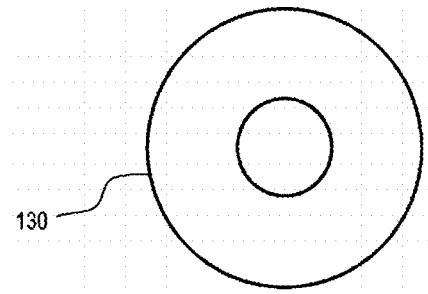
[FIG. 9A]
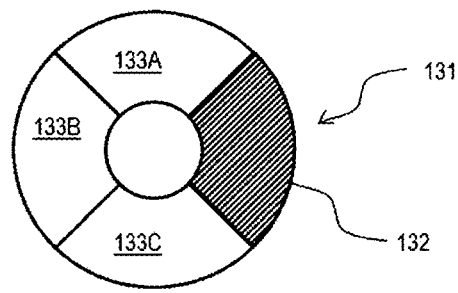
[FIG. 9B]
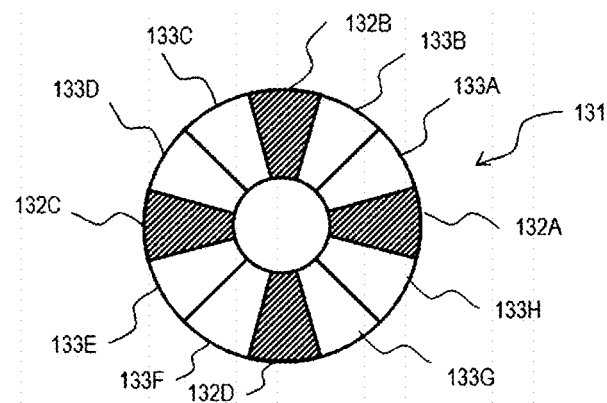

[FIG. 10]
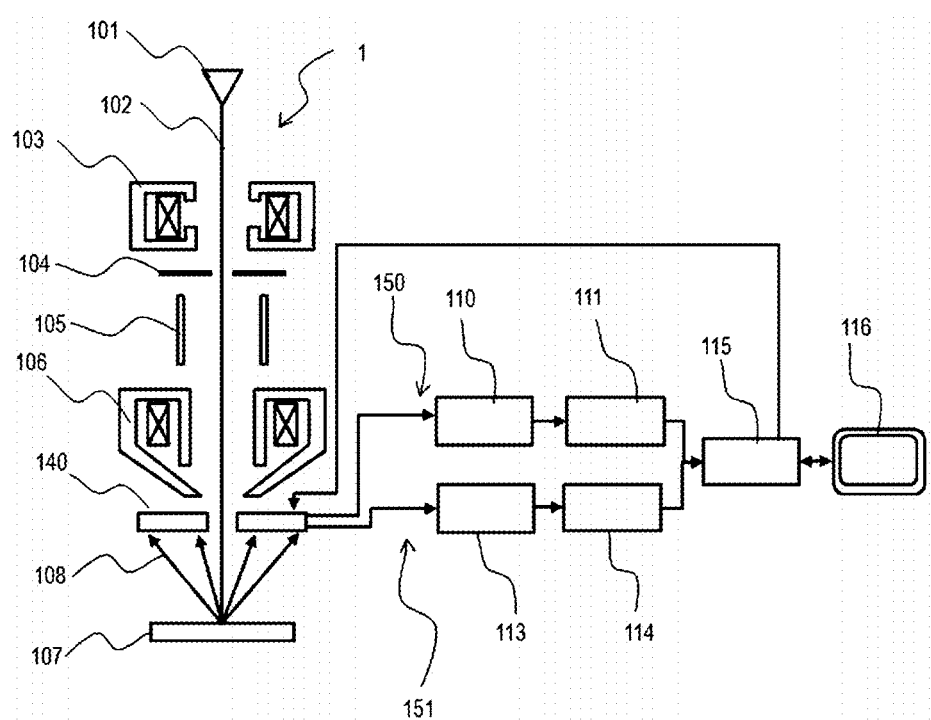

[FIG. 11]
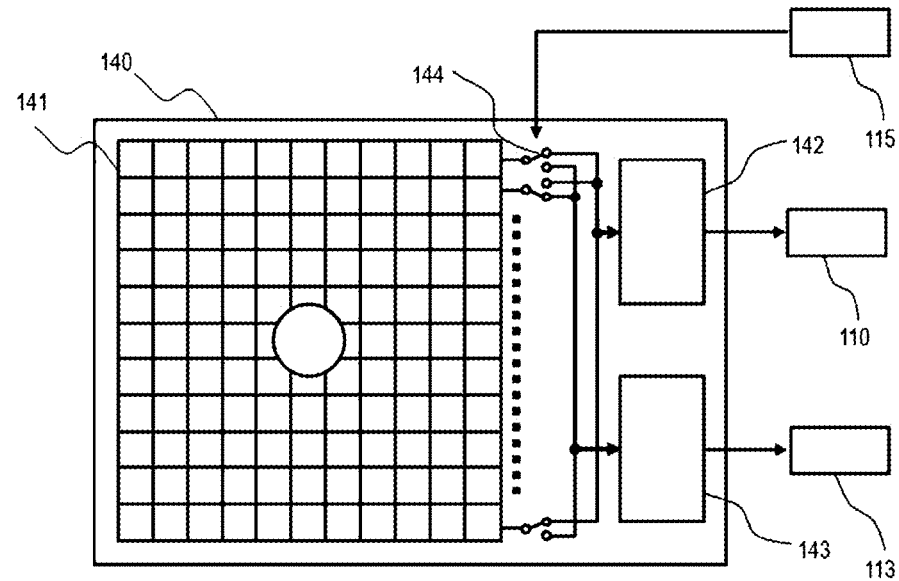
[FIG. 12]
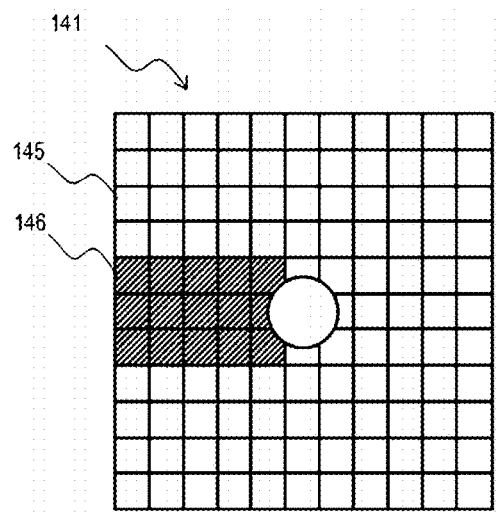

[FIG. 13]
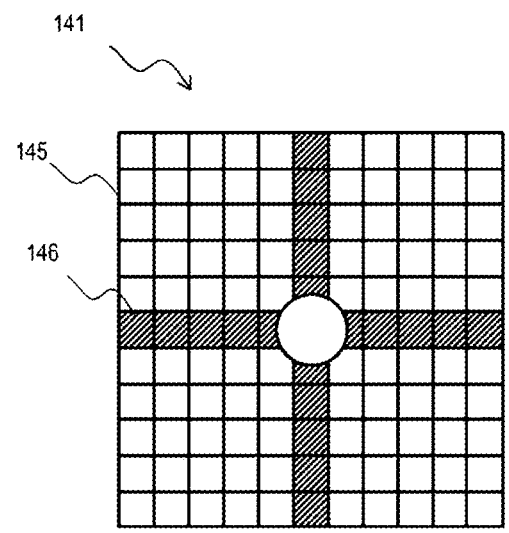
[FIG. 14]
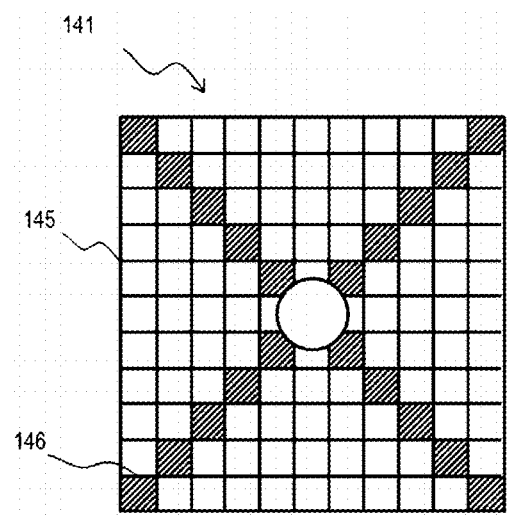

CHARGED PARTICLE BEAM DEVICE

TECHNICAL FIELD

The present invention relates to a charged particle beam device.

BACKGROUND ART

In recent years, a scanning electron microscope (SEM) has been used for observing a surface and a cross section of a target sample in a wide range of fields. In the SEM, secondary electrons (SE) having relatively low energy from 0 to 50 eV and backscattered electrons (BSE) having a wide distribution from 50 eV to energy of a primary electron beam, which are generated by interaction between the primary electron beam and the sample, are detected to form an image.

The SE and BSE include different sample information. For example, the SE includes unevenness information and electrical potential information of a surface of the sample. On the other hand, the BSE includes composition information and crystal information of the sample. In SEM observation, it is important to suitably discriminate and detect signal electrons according to sample information that is desired to acquire. For example, in PTL 1, both an analog detector that integrates and detects an intensity (total energy of SE) of SEs incident on a scintillator in pixel units and a pulse count detector that counts the number of the BSEs in the pixel units are provided, and acquired signals from both detectors are suitably used, so that a pattern edge of the sample is emphasized successfully.

The BSE, one kind of signal electrons emitted from the sample, is an electron that is scattered backward in a process of scattering an incident electron, which is the primary electron beam, in the sample, and is re-emitted from the surface of the sample. A scattering probability is sensitive to a composition of the sample, and as an atomic number of a substance constituting the sample becomes larger, more BSEs are released. Further, since the BSE has energy higher than that of the SE, the BSE is also emitted from a place deeper than the SE.

Statistically, the electrons scattered from a deep portion of the sample have lost much energy from the time of incidence. As an example of utilizing this, an observation method in which only a component having low energy loss (Low Loss-BSE) is subjected to high-pass detection to emphasize information on a surface of a sample is widely practiced.

On the other hand, when band-pass detection can be performed on any BSE energy band, it is expected that a structure and composition distribution in a depth direction of a sample can be observed. For example, PTL 2 describes a pulse-height detector that enables detection of BSE energy by band-pass. The pulse-height detector detects a pulse-height value proportional to energy of each BSE incident on the detector, and histograms the pulse-height values to acquire a BSE energy spectrum. An energy band is freely set for the acquired energy spectrum, and a sum of frequency values within the set energy band is associated with a brightness value to obtain a band-pass image.

CITATION LIST

Patent Literature

PTL 1: JP-A-2016-170896
PTL 2: JP-A-2013-33671

SUMMARY OF INVENTION

Technical Problem

As long as a BSE band-pass image (a brightness value is proportional to the number of electrons in a specified energy band) and a BSE intensity image (a brightness value is proportional to a product of the number of electrons and electron's energy) can be acquired at the same time, it is effective for sample analysis. For example, a method of determining a region of interest (ROI) from a BSE intensity image and acquiring a band-pass image of the ROI can be considered.

The pulse-height detector capable of acquiring a BSE band-pass image detects the energy of each BSE. Since the pulse-height detector includes information on the number of detected BSEs and the energy of each BSE, the pulse-height detector can output an intensity image. However, it is difficult to obtain an intensity image with a high S (signal)/N (noise) ratio by using the pulse-height detector.

The reasons are a response speed limit of an amplifier circuit of the pulse-height detector and an upper limit on a pulse number (the number of BSEs) that can be detected per unit time in order to improve the energy resolution. A current value of the BSE that can be detected by a single pulse-height detector is approximately 10 pA or less. On the other hand, in order to obtain a high S/N ratio in the intensity image, a BSE current value of 100 pA or more is desirable.

Therefore, a charged particle beam device capable of acquiring an image with a high S/N ratio based on an intensity of a charged particle from a sample and an image with high energy resolution based on a pulse-height value is desired.

Solution to Problem

A charged particle beam device according to an aspect of the disclosure includes: a charged particle beam source configured to generate a charged particle beam with which a sample is irradiated; a charged particle detection unit configured to detect a charged particle generated when the sample is irradiated with the charged particle beam; an intensity data generation unit configured to generate intensity data of the charged particle detected by the charged particle detection unit; a pulse-height value data generation unit configured to generate pulse-height value data of the charged particle detected by the charged particle detection unit; and an output unit configured to output a first image of the sample based on the intensity data and a second image of the sample based on the pulse-height value data.

Advantageous Effect

According to one aspect of the disclosure, an image with a high S/N ratio based on an intensity of a charged particle from a sample and an image with high energy resolution based on a pulse-height value can be acquired.

BRIEF DESCRIPTION OF DRAWINGS

FIG. 1 is a schematic view showing a scanning electron microscope (SEM) according to a first embodiment.

FIG. 2 is a display example of an image display unit according to the first embodiment.

FIG. 3 is a display example of the image display unit according to the first embodiment.

FIG. 4 is a display example of the image display unit according to the first embodiment.

FIG. 5 is a display example of the image display unit according to the first embodiment.

FIG. 6 is a display example of the image display unit according to the first embodiment.

FIG. 7 is a schematic view showing a scanning electron microscope (SEM) according to a second embodiment.

FIG. 8 is a schematic diagram of a scintillator of an electron detection unit according to the second embodiment.

FIG. 9A is a schematic diagram of a segmented detector of the electron detection unit according to the second embodiment.

FIG. 9B is a schematic diagram of a segmented detector of the electron detection unit according to the second embodiment.

FIG. 10 is a schematic view showing a scanning electron microscope (SEM) according to a third embodiment.

FIG. 11 is a schematic diagram of a pixel-type electron detector according to the third embodiment.

FIG. 12 is an example of a dividing method of the pixel-type electron detector according to the third embodiment.

FIG. 13 is an example of a dividing method of the pixel-type electron detector according to the third embodiment.

FIG. 14 is an example of a dividing method of the pixel-type electron detector according to the third embodiment.

DESCRIPTION OF EMBODIMENTS

Embodiments will be described below with reference to the accompanying drawings. It should be noted that the present embodiment is merely an example for implementing the disclosure, and does not limit the technical scope of the disclosure. In the drawings, common components are denoted by the same reference numerals.

The present disclosure relates to a charged particle beam device, and particularly to detection of secondary charged particles in a charged particle beam device. The charged particle beam device includes a charged particle source that generates a charged particle beam, a detection unit that detects an intensity of a charged particle generated when a charged particle beam is emitted, and a detection unit that detects a pulse-height value of a charged particle generated when a charged particle beam is emitted. By providing the intensity detection unit and the pulse-height value detection unit, both an intensity image having a high S/N ratio and an energy spectrum image having a high energy resolution can be acquired.

Hereinafter, a scanning electron microscope (SEM) will be described as an example of a charged particle beam scanning device. Features of the present disclosure can be applied to a charged particle beam scanning device whose type is different from SEM.

First Embodiment

Hereinafter, the first embodiment of the invention will be described with reference to the drawings. FIG. 1 is a schematic view of an SEM 1 according to the first embodiment. The SEM1 includes an electron gun 101 which is an electron source (charged particle source), a condenser lens 103, a diaphragm 104, a deflector 105, an objective lens 106, an intensity image detector 150, a pulse-height detector 151, an image processing unit 115, and an image display unit 116.

The image processing unit 115 performs image processing, numerical calculation, and SEM control. The image display unit 116 outputs (displays) an image, and receives input from a user on a graphical user interface (GUI).

An operation outline of the SEM 1 will be described. An electron beam 102 accelerated to a desired acceleration voltage is extracted from the electron gun 101. A current value and a convergence angle of the electron beam 102 with which a sample 107 is irradiated can be set by changing an excitation amount of the condenser lens 103 and a hole diameter of the diaphragm 104. The electron beam 102 is deflected by the deflector 105, narrowed down by the objective lens 106, and then scans a surface of the sample 107.

The SEM 1 detects a backscattered electron (BSE) 108 which is a signal electron emitted by interaction between the electron beam 102 and the sample 107, and acquires an image of the sample by synchronizing with a scanning timing. A brightness value of the image depends on a magnitude of a detection signal.

As one of the features of the present embodiment, the SEM 1 includes two types of detectors for the BSE 108, specifically, the intensity image detector 150 and the pulse-height detector 151. By providing the intensity image detector 150 and the pulse-height detector 151, both an intensity image having a high S/N ratio and an energy spectrum image having a high energy resolution can be acquired.

The intensity image detector 150 includes an intensity image electron detection unit 109, an intensity image amplification unit 110, and an intensity image imaging unit 111. The intensity image imaging unit 111 is an example of an intensity data generation unit. The intensity image electron detection unit 109 has, for example, a coaxial cylindrical shape and is disposed directly under the objective lens. With such arrangement, a large amount of BSE 108 generated from the sample can be detected.

The intensity image electron detection unit 109 outputs a current signal having a magnitude proportional to a total energy of the BSE 108 incident per unit time. As the intensity image electron detection unit 109, a semiconductor detector such as a Si-PIN photodiode or a Si-APD photodiode, or a combination of a YAG scintillator and a photomultiplier tube is used.

The current signal output from the intensity image electron detection unit 109 is input to the intensity image amplification unit 110. The intensity image amplification unit 110 includes a transimpedance amplifier and a voltage amplifier circuit. The intensity image amplification unit 110 converts the current signal output from the intensity image electron detection unit 109 into a voltage by using the transimpedance amplifier, and the voltage amplifier circuit amplifies the voltage to a level that can be easily handled by a circuit in a subsequent stage. The intensity image imaging unit 111 AD-converts the signal output from the intensity image amplification unit 110 and stores the signal in an image memory.

The pulse-height detector 151 includes a pulse-height discrimination electron detection unit 112, a pulse-height discrimination amplification unit 113, and a pulse-height discrimination imaging unit 114. The pulse-height discrimination imaging unit 114 is an example of a pulse-height value data generation unit. A charged particle detection unit (or electron detection unit) of the SEM 1 includes the pulse-height discrimination electron detection unit 112 and the intensity image electron detection unit 109.

A detailed configuration of the pulse-height detector 151 is different from that of the intensity image detector 150. The pulse-height discrimination electron detection unit 112 outputs a pulse current signal having a magnitude proportional to energy of each incident BSE 108. A semiconductor detector such as a Si-PIN photodiode having a small shot noise is used as the pulse-height discrimination electron detection unit 112.

A solid angle of an electron sensitive surface (also simply referred to as a sensitive surface) of the pulse-height discrimination electron detection unit 112 viewed from the sample 107 is smaller than a solid angle of a sensitive surface of the intensity image electron detection unit 109 viewed from the sample 107. This is because the pulse-height discrimination electron detection unit 112 has a limit on a current amount of the BSE 108.

In order to acquire the intensity image with a high S/N ratio, it is desirable to detect a large BSE current. On the other hand, in the pulse-height detector 151, it is necessary to separately acquire a pulse current signal of each individual BSE. Further, a response speed of the pulse-height discrimination amplification unit 113 is limited. Therefore, it is important to make the current amount of the incident BSE smaller than that of the intensity image detector.

By making the solid angle of the sensitive surface of the pulse-height discrimination electron detection unit 112 viewed from the sample smaller than the solid angle of the sensitive surface of the intensity image electron detection unit 109 viewed from the sample, a BSE incidence amount on the pulse-height discrimination electron detection unit 112 can be made smaller than a BSE incidence amount on the intensity image electron detection unit 109.

The solid angle viewed from the sample 107 depends on an area of the sensitive surface and a distance from the sample 107 to the sensitive surface. In the present embodiment, the pulse-height discrimination electron detection unit 112 is provided at a position farther from the sample 107 than the intensity image electron detection unit 109. Further, the sensitive surface of the pulse-height discrimination electron detection unit 112 is smaller than the sensitive surface of the intensity image electron detection unit 109.

Further, in order to improve energy resolution of the pulse-height detector 151, it is necessary to reduce noise generated in the pulse-height discrimination amplification unit 113. The noise generated in the pulse-height discrimination amplification unit 113 depends on a size of a parasitic capacitance of the pulse-height discrimination electron detection unit 112, and as the parasitic capacitance becomes smaller, the noise reduces. The parasitic capacitance is approximately proportional to the area of the sensitive surface. Therefore, by making a size of the sensitive surface of the pulse-height detector 151 smaller than that of the intensity image detector 150, the noise generated in the pulse-height discrimination amplification unit 113 can be reduced.

There is also a semiconductor detector, such as a silicon drift detector (SDD) that can reduce the parasitic capacitance even when the size of the sensitive surface is large, used as the electron detection unit. In order to improve the energy resolution of the pulse-height detector 151, it is considered to use the SDD. When a sensitive surface of the SDD is large, for example, the current amount of the BSE can be limited by increasing a distance between the sample 107 and the SDD, or by performing intensity measurement and pulse-height value measurement in different periods and reducing a current value of the electron beam 102 for the pulse-height value measurement.

The pulse current output from the pulse-height discrimination electron detection unit 112 is input to the pulse-height discrimination amplification unit 113. The pulse-height discrimination amplification unit 113 includes a transimpedance amplifier and a voltage amplifier circuit. A bandwidth of the transimpedance amplifier or the voltage amplifier circuit of the pulse-height detector 151 is wider than that of the intensity image amplification unit 110, so that a pulse waveform can be kept.

The pulse-height discrimination amplification unit 113 converts the pulse current output from the pulse-height discrimination electron detection unit 112 into a voltage by using the transimpedance amplifier, and the voltage amplifier circuit amplifies the voltage to a level that can be easily handled by a circuit in a subsequent stage. The pulse-height discrimination imaging unit 114 AD-converts the pulse signal output from the pulse-height discrimination amplification unit 113. The pulse-height discrimination imaging unit 114 detects a pulse-height value, forms a histogram for each pixel of an image, and stores the histogram in a histogram memory as an energy spectrum.

The image processing unit 115 acquires data from the image memory of the intensity image imaging unit 111 and the histogram memory of the pulse-height discrimination imaging unit 114, generates specific image data, and displays the data on the image display unit 116.

Each image processing unit 115 can be configured with a processor that executes a program. These programs can be executed by the same or different processors. A part or all these functions can be configured with a specific integrated circuit. Further, the intensity image imaging unit 111 and the pulse-height discrimination imaging unit 114 can be configured with, for example, an AD converter, the histogram memory, and a processor such as an FPGA.

FIG. 2 shows an example of a display image by the image display unit 116 (an example of the output unit). The image processing unit 115 adjusts brightness and contrast of intensity image data stored in the image memory of the intensity image imaging unit 111, and displays an intensity image 117 on the image display unit 116.

Hereinafter, an example of displaying a band-pass image of an ROI 118 designated by the user on the intensity image 117 will be described. The pulse-height discrimination imaging unit 114 stores the energy spectrum of each image pixel.

The user designates a pixel point 120 from which an energy spectrum is extracted on a displayed temporary band-pass image 119 via a GUI of the image display unit 116. The image processing unit 115 displays a temporary band-pass image and receives user designation of the pixel point 120. The temporary band-pass image is, for example, an all-pass image.

The all-pass image is an image showing a total number of frequencies in an entire energy region of each image pixel, that is, a total number of electrons of each image pixel. The image processing unit 115 acquires the energy spectrum of each pixel acquired from the pulse-height discrimination imaging unit 114, and calculates the total number of frequencies in the entire energy region in each pixel.

The image processing unit 115 causes the image display unit 116 to display an energy spectrum 121 of the pixel point 120 designated by the user. The user designates a specific energy band 122 from the energy spectrum 121 of the pixel point 120 via the GUI of the image display unit 116.

The image processing unit 115 receives designation of the energy band 122 by the user, integrates the frequencies within the designated energy band, and displays the band-pass image 119. While viewing the displayed band-pass image 119, the user can also move the energy extraction pixel point 120 and reset the energy band 122.

A method for improving energy resolution of an energy spectrum acquired by the pulse-height detector 151 by digital signal processing will be described below with reference to FIGS. 3 to 6. Each of FIGS. 3 to 6 shows an image example displayed by the image display unit 116. In some cases, since the energy resolution of the pulse-height detector 151 is insufficient, a desired spectral peak cannot be observed. In such cases, the digital signal processing can be used to improve the energy resolution.

A direct method and an iterative method exist as algorithms for the digital signal processing. The direct method improves the energy resolution by previously obtaining an inverse matrix of a response function matrix of the pulse-height detector 151 and multiplying the inverse matrix by the measured energy spectrum. The direct method has an advantage that a calculation processing time is decisive and short, but an energy resolution improvement rate is low.

On the other hand, the iterative method uses the response function matrix but does not obtain the inverse matrix. The energy resolution is improved by iterative calculation using a Jacobi method or a Gauss-Seidel method. The iterative method is non-decisive and long in calculation time, but has an energy resolution improvement rate higher than that of the direct method.

As shown in FIG. 3, the image processing unit 115 displays buttons 123, 124, so that the user can select one of the two types of algorithms. For example, the button 123 is referred to as the direct method and the button 124 is referred to as the iterative method.

As shown in FIG. 4, when the user presses the button 123, the image processing unit 115 applies the direct method to the data acquired by the pulse-height detector 151, and displays an energy spectrum 126 after the application. At this time, an energy spectrum 125 before the application can be displayed at the same time, and the user can compare the spectra before and after the algorithm is applied. In the image example of FIG. 4, the energy spectrum 125 before the application is represented by a broken line, and the energy spectrum 126 after the application is represented by a solid line.

When spectral peaks can be separated by applying the direct method, as shown in FIG. 4, the image processing unit 115 displays positions 127 of the spectral peaks to the user. The spectral peak can be specified by a derivative of the spectrum. Based on the display, the user can determine whether or not to improve the energy resolution by taking a longer calculation processing time.

As shown in FIG. 5, when the user presses the button 124, the image processing unit 115 applies the iterative method to the data acquired by the pulse-height detector 151, and displays an energy spectrum 128 after the application. The energy spectrum 128 is an energy spectrum whose energy resolution is further improved as compared with the energy spectrum 126 obtained by the direct method. In the image example of FIG. 5, the energy spectrum 125 before the application is represented by a broken line, and the energy spectrum 128 after the application is represented by a solid line.

The user can specify one or more energy bands in the energy spectrum 126 or 128 after the energy resolution is improved, and acquire band-pass images thereof. FIG. 6 shows band-pass images 119A, 119B of designated energy bands 122A, 122B in respective energy spectra 128A, 128B.

More specifically, the image display unit 116 shows the energy spectrum 128A at the pixel point 120A, and the energy band 122A is designated by the user. The band-pass image 119A is a band-pass image of this energy band 122A. The band-pass image 119A and the intensity image 117 are displayed in different colors in an overlapping manner.

The image display unit 116 further shows the energy spectrum 128B at the pixel point 120B, and the energy band 122B is designated by the user. The band-pass image 119B is a band-pass image of this energy band 122B. The band-pass image 119B and the intensity image 117 are displayed in different colors in an overlapping manner.

By displaying the band-pass images of different energy bands 122A, 122B on the intensity images 117 in different colors in an overlapping manner, information on different compositions and a structure in a depth direction of the sample can be easily recognized.

As described above, by separately providing the BSE intensity image detector and the BSE pulse-height detector, both the BSE intensity image with a high S/N ratio and the band-pass image with high energy resolution can be acquired.

Second Embodiment

FIG. 7 is a schematic view of an SEM 1 according to the second embodiment. The same reference numerals are given to the same elements as the configuration shown in FIG. 1 of the first embodiment. One of the differences between a configuration of the SEM 1 of the present embodiment and the configuration of the first embodiment is the configuration of the BSE detection unit (charged particle detection unit) of the SEM 1.

In the first embodiment, the BSE detection unit of the SEM 1 is configured with the intensity image electron detection unit 109 and the pulse-height discrimination electron detection unit 112. As shown in FIG. 1, the intensity image electron detection unit 109 and the pulse-height discrimination electron detection unit 112 are separate devices, and are disposed at different distances from the sample 107.

In the second embodiment, the BSE detection unit (charged particle detection unit) of the SEM 1 is a combination of a scintillator 130 and a segmented electron detector 131, and is provided in a barrel in a shape of a coaxial cylinder. FIG. 8 shows a schematic diagram of the scintillator 130. Further, FIGS. 9A and 9B show schematic diagrams of the segmented electron detector 131. A Si-PIN photodiode or SiPM is used for the electron detector 131.

When the BSE 108 injects the scintillator 130, photons whose amount is proportional to energy of the BSE 108 are generated. The subsequent electron detector 131 detects the photons. The scintillator 130 and the electron detector 131 are preferably provided close to each other, so that photons are not escaped as much as possible. When a distance between the scintillator 130 and the electron detector 131 cannot be reduced, a light guide is disposed therebetween to reduce an amount of lost photons.

The segmented electron detector 131 (a sensitive surface thereof) shown in FIG. 9A is divided into 12 equal parts along a circumference. Three parts 133A, 133B and 133C are used for the intensity image. A remaining part 132 is used for pulse-height discrimination. In this way, a large sensitive surface area is assigned for the intensity image and a small sensitive surface area is assigned for the pulse-height discrimination. As a result, the BSE current amount incident on the electron detector 133 is large for the intensity image and is small for the pulse-height discrimination. Further, since the sensitive surface area for the pulse-height discrimination is small, the parasitic capacitance of the electron detection unit is small.

The segmented electron detector 131 (a sensitive surface thereof) shown in FIG. 9B is divided into 12 equal parts along a circumference. Eight parts 133A to 133B are used for the intensity image. Remaining four parts 132A to 132D are used for pulse-height discrimination. In this way, a large sensitive surface area is assigned for the intensity image and a small sensitive surface area is assigned for the pulse-height discrimination. As a result, the BSE current amount incident on the electron detector 131 is large for the intensity image and is small for the pulse-height discrimination. Further, since the sensitive surface area for the pulse-height discrimination is small, the parasitic capacitance of the electron detection unit is small.

Further, the parts 132A to 132D for the pulse-height discrimination are line-symmetric with respect to any two vertical axes in a plane. Similarly, the parts 133A to 133B for the intensity image are line-symmetric with respect to any two vertical axes in a plane. Therefore, dependency of the acquired BSE 108 on a sample direction can be eliminated, and illumination effect can be reduced.

As described above, by using the large area part of the segmented electron detection unit for the intensity image and using the small area for the pulse-height discrimination, both the BSE intensity image having a high S/N ratio and a band-pass image having high energy resolution can be acquired.

Third Embodiment

FIG. 10 is a schematic view of an SEM 1 according to the third embodiment. The same reference numerals are given to the same elements as the configuration shown in FIG. 1 of the first embodiment. One of the differences between a configuration of the SEM 1 of the present embodiment and the configuration of the first embodiment is the configuration of the BSE detection unit (charged particle detection unit) of the SEM 1.

FIG. 11 shows a pixel-type electron detector 140 which is a BSE detection unit according to the third embodiment. The pixel-type electron detector 140 includes a pixel-type electron detection unit 141, a switch 144, an intensity image preamplifier 142, and a pulse-height discrimination preamplifier 143. A Si-PIN photodiode or SiPM, or the like is used for the pixel-type electron detection unit 141. The pixel-type electron detector 140 is formed with a hole through which the electron beam 102 can pass. The pixel-type electron detector 140 is disposed immediately below the objective lens, so that a large amount of the BSE 108 generated from the sample can be detected.

By controlling a connection state of the switch 144, a connection relationship between each pixel of the pixel-type electron detection unit 141 with the intensity image preamplifier 142 and with the pulse-height discrimination preamplifier 143 can be determined. The image processing unit 115 controls the connection state of the switch 144. FIG. 11 schematically shows connection between the switch 144 and the pixel-type electron detection unit 141.

The intensity image preamplifier 142 and the pulse-height discrimination preamplifier 143 are configured with a transimpedance amplifier that converts a current signal output from the pixel type electron detection unit 141 into a voltage. In the first and second embodiments, the transimpedance amplifier is included in the intensity image amplification unit 110 and the pulse-height discrimination amplification unit 113. The intensity image amplification unit 110 and the pulse-height discrimination amplification unit 113 are provided at positions apart from the intensity image electron detection unit 109 and the pulse-height discrimination electron detection unit 112, and are connected thereto by a cable.

On the other hand, in the third embodiment, the transimpedance amplifier is disposed at a position closer to the electron detection unit. Therefore, parasitic capacitance and parasitic inductance of a wire between the electron detection unit and the transimpedance amplifier can be reduced, and as a result, noise can be reduced and signal oscillation can be prevented.

In one example, the pixel-type electron detection unit 141, the switch 144, and the preamplifiers 142, 143 are integrally mounted on a semiconductor integrated circuit (an integrated circuit on a same semiconductor substrate). The pixel-type electron detection unit 141 and the switch 144 are integrally mounted on a semiconductor integrated circuit, and the silicon integrated circuit may be connected to the preamplifiers 142, 143 which are other semiconductor elements on a printed-circuit board by printed wire.

FIGS. 12, 13 and 14 are plan views showing examples of the pixel-type electron detection unit 141 of different switch connection examples in the third embodiment. FIGS. 12, 13 and 14 show sensitive surfaces of the pixel-type electron detection unit 141. The pixel-type electron detection unit 141 is configured with a plurality of pixels shown by a quadrangle.

In the plan view, the pixel-type electron detection unit 141 and the pixels are in a positive direction. A hole through which the electron beam 102 passes is formed in a center of the pixel-type electron detection unit 141. A sensitive surface of the intensity image electron detection unit 145 is configured with white pixels, and a sensitive surface of the pulse-height discrimination electron detection unit 146 is configured with hatched pixels.

In any of the examples shown in FIGS. 12, 13 and 14, a sensitive surface area of the intensity image electron detection unit 145 is larger than a sensitive surface area of the pulse-height discrimination electron detection unit 146. As a result, the BSE current amount for the intensity image incident on the pixel-type electron detection unit 141 increases, and the BSE current amount for pulse-height discrimination decreases. Further, since the sensitive surface area of the pulse-height discrimination electron detection unit 146 is small, the parasitic capacitance of the pulse-height discrimination electron detection unit 146 can be reduced.

In the example shown in FIG. 12, the pulse-height discrimination electron detection unit 146 and the intensity image electron detection unit 145 are respectively line-symmetric with respect to one axis extending in a left-right direction of the drawing, but are asymmetric with respect to the axis extending in an up-down direction. Therefore, the dependency of the acquired BSE 108 on the sample direction exists.

In the example shown in FIGS. 13 and 14, the pulse-height discrimination electron detection unit 146 is configured with a plurality of portions of the same shape that are separated in a circumferential direction. The pulse-height discrimination electron detection unit 146 and the intensity image electron detection unit 145 are line-symmetric with respect to each of two orthogonal axes. Therefore, the dependency, which is generated in the example of FIG. 12, of the acquired BSE 108 on the sample direction can be eliminated, and the illumination effect can be reduced.

As described above, by using the large area part of the pixel-segmented electron detection unit for the BSE intensity image and using the small area for the BSE pulse-height discrimination, both the BSE intensity image having a high S/N ratio and the band-pass image having high energy resolution can be acquired.

Fourth Embodiment

In the first, second and third embodiments, the sensitive surface of the intensity image electron detection unit and the sensitive surface of the pulse-height discrimination electron detection unit are different, the sensitive surfaces are disposed at different positions, and the positions and shapes thereof are fixed. For example, in the segmented type electron detector 131 shown in FIG. 9A of the second embodiment, the three parts 133A, 133B, and 133C are always used for the intensity images, and one part 132 is always used for the pulse-height discrimination. The parts 133A, 133B, and 133C are disposed at positions different from the part 132, and shapes thereof are constant.

Alternatively, in the example shown in FIGS. 12, 13 and 14 of the third embodiment, the pulse-height discrimination electron detection unit 146 and the intensity image electron detection unit 145 are disposed at different positions, and the positions and shapes thereof are fixed. In this way, by disposing the intensity image electron detection unit and the pulse-height discrimination electron detection unit at different positions, an intensity image electron and a pulse-height discrimination electron can be measured at the same time.

Unlike these embodiments, in the present embodiment, one same sensitive surface is used for both the intensity image electron and the pulse-height discrimination electron. That is, one physical electron detection unit is commonly used for the intensity image and the pulse-height discrimination. Specifically, in the present embodiment, the electron detection unit is used for the intensity image in a first period, and the electron detection unit is used for the pulse-height discrimination in a second period different from the first period. The electron detection unit is the intensity image electron detection unit in the first period, and is the pulse-height discrimination electron detection unit in the second period. As a result, the number of components of the electron detection unit can be reduced, and the area of an intensity sensitive surface can be increased.

For example, the electron detection unit (charged particle detection unit) of the SEM 1 is, as in the second embodiment, a combination of the scintillator 130 and the segmented electron detector 131. The electron detection unit is connected to the intensity image amplification unit and the pulse-height discrimination amplification unit via a switch. The image processing unit 115 operates the switch to connect the electron detection unit to one of the intensity image amplification unit and the pulse-height discrimination amplification unit.

For example, in the first period, the image processing unit 115 connects the intensity image amplification unit to all or a part of the segmented electron detector 131. In the second period, the image processing unit 115 connects a part of a portion of the electron detector 131 to the pulse-height discrimination amplification unit. In another example, the image processing unit 115 may connect all parts of the electron detector 131 to the pulse-height discrimination amplification unit in the second period, and make a current amount of the electron beam 102 smaller than that in the first period. This control can also be applied to an unsegmented electron detector.

As another example, the electron detection unit (charged particle detection unit) of SEM 1 may be the pixel-type electron detector as in the third embodiment. In the first period, the image processing unit 115 connects the intensity image amplification unit to all pixels. In the second period, the image processing unit 115 connects some pixels to the pulse-height discrimination amplification unit. The image processing unit 115 may connect all the pixels to the pulse-height discrimination amplification unit in the second period, and make the current amount of the electron beam 102 smaller than that in the first period.

As described above, by decreasing a pulse-height discrimination BSE current and increasing an intensity image BSE current, both the BSE intensity image having a high S/N ratio and the band-pass image with high energy resolution can be acquired.

The invention is not limited to the above-mentioned embodiments, and includes various modifications. For example, the embodiments described above are described in detail for easy understanding of the invention, and the invention is not necessarily limited to those including all the configurations described above. In addition, a part of the configuration of one embodiment can be replaced with the configuration of another embodiment, and the configuration of another embodiment can be added to the configuration of one embodiment. In addition, a part of the configuration of each embodiment may be added, deleted, or replaced with another configuration.

Further, each of the above-described configurations, functions, process units, and the like may be partially or entirely implemented by hardware such as through design using an integrated circuit. Further, the above configurations, functions, or the like may be implemented by software by means of a processor interpreting and executing a program for implementing respective functions. Information of programs, tables, files or the like for implementing each function can be placed in a recording device such as a memory, a hard disk, and a solid state drive (SSD), or a recording medium such as an IC card, an SD card.

Further, control lines and information lines show those considered to be necessary for the description, and not all the control lines and the information lines are necessarily shown on the product. In practice, it may be considered that almost all the configurations are connected to each other.

The invention claimed is:

1. A charged particle beam device comprising:
    a charged particle beam source configured to generate a charged particle beam with which a sample is irradiated;
    a charged particle detector, comprising a Si-PIN photodiode, a Si-APD photodiode, or a combination of a YAG scintillator and a photomultiplier tube configured to detect a charged particle generated when the sample is irradiated with the charged particle beam and to produce a current signal corresponding to the charged particle intensity;
    an intensity data generator, comprising a transimpedance amplifier and a first analog to digital converter configured to generate intensity data of the charged particle detected by the charged particle detector;
    a pulse-height value data generator, comprising a transimpedance amplifier and a second analog to digital converter configured to generate pulse-height value data of the charged particle detected by the charged particle detector; and
    one or more processors and one or more non-transitory computer-readable storage media, the non-transitory computer-readable storage media having stored thereon at least an output unit configured to generate a first image of the sample based on the intensity data and a second image of the sample based on the pulse-height value data.

2. The charged particle beam device according to claim 1, wherein
in the charged particle detector, a solid angle, viewed from the sample, of a sensitive surface of the charged particle detector for which the intensity data is generated is larger than a solid angle, viewed from the sample, of a sensitive surface of a charged particle for which the pulse-height value data is generated.

3. The charged particle beam device according to claim 1, wherein
in the charged particle detection unit, a sensitive surface area of the charged particle detector for which the intensity data is generated is larger than a sensitive surface area of a charged particle for which the pulse-height value data is generated.

4. The charged particle beam device according to claim 1, wherein
at least a part of a sensitive surface of the charged particle detector is used for detecting a charged particle for which the intensity data is generated in a first period, and is used for detecting a charged particle for which the pulse-height value data is generated in a second period different from the first period.

5. The charged particle beam device according to claim 1, wherein
the charged particle detector includes
 a first charged particle detector configured to detect a charged particle for which the intensity data is generated; and
 a second charged particle detector disposed at a position different from the first charged particle detector, and configured to detect a charged particle for which the pulse-height value data is generated.

6. The charged particle beam device according to claim 5, wherein
the charged particle detector includes a plurality of pixels,
a first part of the plurality of pixels is used for detecting a charged particle for which the intensity data is generated,
a second part of the plurality of pixels is used for detecting a charged particle for which the pulse-height value data is generated, and
the number of pixels in the first part is more than the number of pixels in the second part.

7. The charged particle beam device according to claim 1, wherein
the charged particle detector and a preamplifier configured to amplify a current signal of the charged particle detection unit are accommodated in a silicon integrated circuit.

8. The charged particle beam device according to claim 1, wherein
the second image is a band-pass image using an energy band of a part of an energy spectrum of the charged particle.

9. The charged particle beam device according to claim 8, wherein
the output unit displays the first image and the second image in an overlapping manner.

10. The charged particle beam device according to claim 1,
wherein the output unit is further configured to perform digital signal processing to improve energy resolution of the pulse-height value data.

11. The charged particle beam device according to claim 10,
wherein the output unit is further configured to allow an algorithm of the
digital signal processing to be switched according to a user designation.

12. The charged particle beam device according to claim 10, wherein
the output unit displays an energy spectrum including peaks separated by applying the algorithm of the digital signal processing.

13. The charged particle beam device according to claim 10, wherein
the output unit simultaneously displays an energy spectrum after the digital signal processing is performed and an energy spectrum before the digital signal processing is performed.

* * * * *